(12) United States Patent
Han et al.

(10) Patent No.: US 7,582,532 B2
(45) Date of Patent: Sep. 1, 2009

(54) METHOD FOR FABRICATING SEMICONDUCTOR DEVICE

(75) Inventors: Ky-Hyun Han, Ichon-shi (KR); Seung-Bum Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 243 days.

(21) Appl. No.: 11/477,866

(22) Filed: Jun. 30, 2006

(65) Prior Publication Data

US 2007/0099383 A1    May 3, 2007

(30) Foreign Application Priority Data

Oct. 28, 2005    (KR) ........................ 10-2005-0102435

(51) Int. Cl.
*H01L 21/336* (2006.01)
(52) U.S. Cl. .................. 438/270; 438/277; 438/259; 438/689; 438/700; 438/701; 438/706; 438/713
(58) Field of Classification Search ................ 438/689, 438/700, 701, 706, 713, 259, 270, 277
See application file for complete search history.

(56) References Cited

U.S. PATENT DOCUMENTS

| 5,122,225 | A | * | 6/1992 | Douglas | 438/642 |
| 5,629,226 | A | * | 5/1997 | Ohtsuki | 438/389 |
| 5,849,638 | A | * | 12/1998 | Ho et al. | 438/712 |
| 5,891,807 | A | * | 4/1999 | Muller et al. | 438/713 |
| 6,008,104 | A | * | 12/1999 | Schrems | 438/386 |
| 6,455,378 | B1 | * | 9/2002 | Inagawa et al. | 438/270 |
| 6,541,380 | B2 | * | 4/2003 | Ying et al. | 438/689 |
| 6,579,796 | B2 | * | 6/2003 | Ying et al. | 438/689 |
| 6,696,365 | B2 | * | 2/2004 | Kumar et al. | 438/706 |
| 6,723,617 | B1 | * | 4/2004 | Choi | 438/424 |
| 6,822,288 | B2 | * | 11/2004 | Hshieh et al. | 257/330 |
| 6,833,079 | B1 | * | 12/2004 | Giordani | 216/2 |
| 6,939,811 | B2 | * | 9/2005 | Kamp et al. | 438/734 |
| 2003/0189024 | A1 | * | 10/2003 | Khan et al. | 216/2 |
| 2003/0235958 | A1 | * | 12/2003 | Chan et al. | 438/270 |
| 2004/0224520 | A1 | * | 11/2004 | Yun et al. | 438/691 |
| 2004/0235253 | A1 | * | 11/2004 | Kim | 438/296 |
| 2005/0023242 | A1 | * | 2/2005 | Nguyen et al. | 216/20 |
| 2005/0189653 | A1 | * | 9/2005 | Tao et al. | 257/758 |
| 2006/0160366 | A1 | * | 7/2006 | Lu et al. | 438/717 |

FOREIGN PATENT DOCUMENTS

KR    10-2000-0060693 A    10/2000

* cited by examiner

*Primary Examiner*—Thanh V Pham
*Assistant Examiner*—Caleb Henry
(74) *Attorney, Agent, or Firm*—Finnegan, Henderson, Farabow, Garrett & Dunner, L.L.P.

(57) ABSTRACT

A method for fabricating a semiconductor device includes etching a predetermined portion of a substrate to form a first recess having a bottom middle portion roundly projected and bottom edge portions tapered to have a micro-trench profile; and etching the substrate beneath the first recess to form a second recess, the second recess being rounded and being wider than the first recess.

17 Claims, 8 Drawing Sheets

METHOD FOR FABRICATING SEMICONDUCTOR DEVICE

RELATED APPLICATION

The present application is based upon and claims the benefit of priority to Korean patent application No. KR 2005-0102435, filed in the Korean Patent Office on Oct. 28, 2005, the entire contents of which are incorporated herein by reference.

TECHNICAL FIELD

The present invention relates to a method for fabricating a semiconductor device; and more particularly, to a method for fabricating a semiconductor device with a recess gate.

DESCRIPTION OF RELATED ARTS

As for a typical method for forming a planar gate interconnection line by forming a gate over a flat active region, the current large scale integration of semiconductor devices has caused a channel length to be decreased but an implantation doping concentration to be increased. Accordingly, due to an increased electric field, a junction leakage is generated and thus, it becomes difficult to secure a satisfactory refresh property of a device.

A recess gate process forming a gate after etching a substrate defined into an active region to a recess pattern is implemented as a method for forming a gate interconnection line to solve the aforementioned problems. If the recess gate process is used, a channel length can be increased and an implantation doping concentration can be decreased. Accordingly, a refresh property of a device can be improved.

FIGS. 1A and 1B are cross-sectional views illustrating a typical method for fabricating a semiconductor device.

As shown in FIG. 1A, a plurality of device isolation layers 12 defining an active region are formed in certain portions of a substrate 11. A mask pattern 13 is formed over the substrate 11 including the device isolation layers 12. Herein, the mask pattern 13 is formed by sequentially stacking a pad oxide layer 13A, a hard mask 13B, and a photoresist layer 13C.

As shown in FIG. 1B, predetermined portions of the substrate 11 are etched using the mask pattern 13 as an etch mask to form a plurality of recesses 14. After the recesses 14 are formed, the mask pattern 13 is removed.

FIG. 2 is a micrographic image of a 'U' shaped recess profile of the semiconductor device formed by the typical method. FIG. 2 shows a channel length $D_1$ and a stress point formed at a top corner 40.

The typical method illustrated in FIGS. 1A and 1B provides a longer channel length and a better refresh property than a planar gate pattern. However, the pattern needs to be micronized as the size of the semiconductor devices is decreased, and a distance between channels needs to be longer as a distance between the devices is decreased.

Furthermore, a horn may be formed at edges of the active region after the recesses are formed. Thus, electric charges may be localized around the horn and a leakage current may be generated.

SUMMARY

The present invention provides a method for fabricating a semiconductor device with a recess gate lengthening a channel by removing a horn.

A method for fabricating a semiconductor device, consistent with the embodiments of the present invention, includes etching a predetermined portion of a substrate to form a first recess having a bottom middle portion roundly projected and bottom edge portions tapered to have a micro-trench profile; and etching the substrate beneath the first recess to form a second recess, the second recess being rounded and being wider than the first recess.

A method for fabricating a semiconductor device, consistent with the embodiments of the present invention, includes etching a predetermined portion of a substrate to form a first recess having a roundly projected bottom middle portion and bottom edge portions tapered to have a micro-trench profile; etching the substrate beneath the first recess to form a second recess, the second recess being rounded and being wider than the first recess; rounding top corners of the first recess; forming a gate insulation layer over the substrate with the first recess and the second recess formed therein; and forming a gate pattern having a first portion filled into the first and second recesses and a second portion projected above the substrate over the gate insulation layer.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION

Hereinafter, detailed descriptions of embodiments of the present invention will be provided with reference to the accompanying drawings.

FIGS. 3A to 3E are cross-sectional views illustrating a method for fabricating a semiconductor device consistent with a first embodiment of the present invention.

Figure 1A:
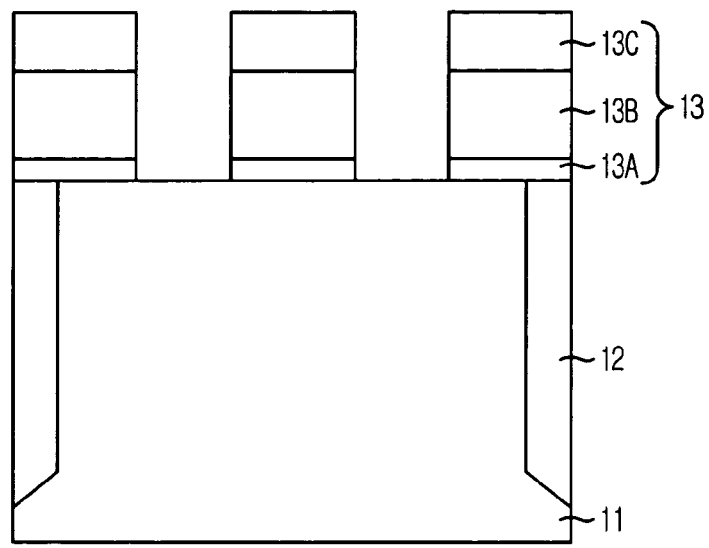
FIGS. 1A and 1B are cross-sectional views illustrating a typical method for fabricating a semiconductor device.
Figure 1B:
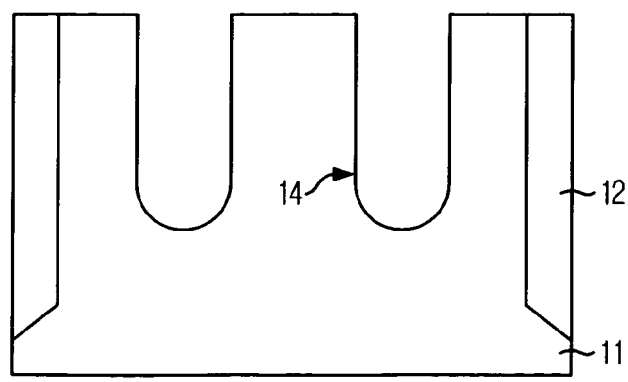
Figure 2:
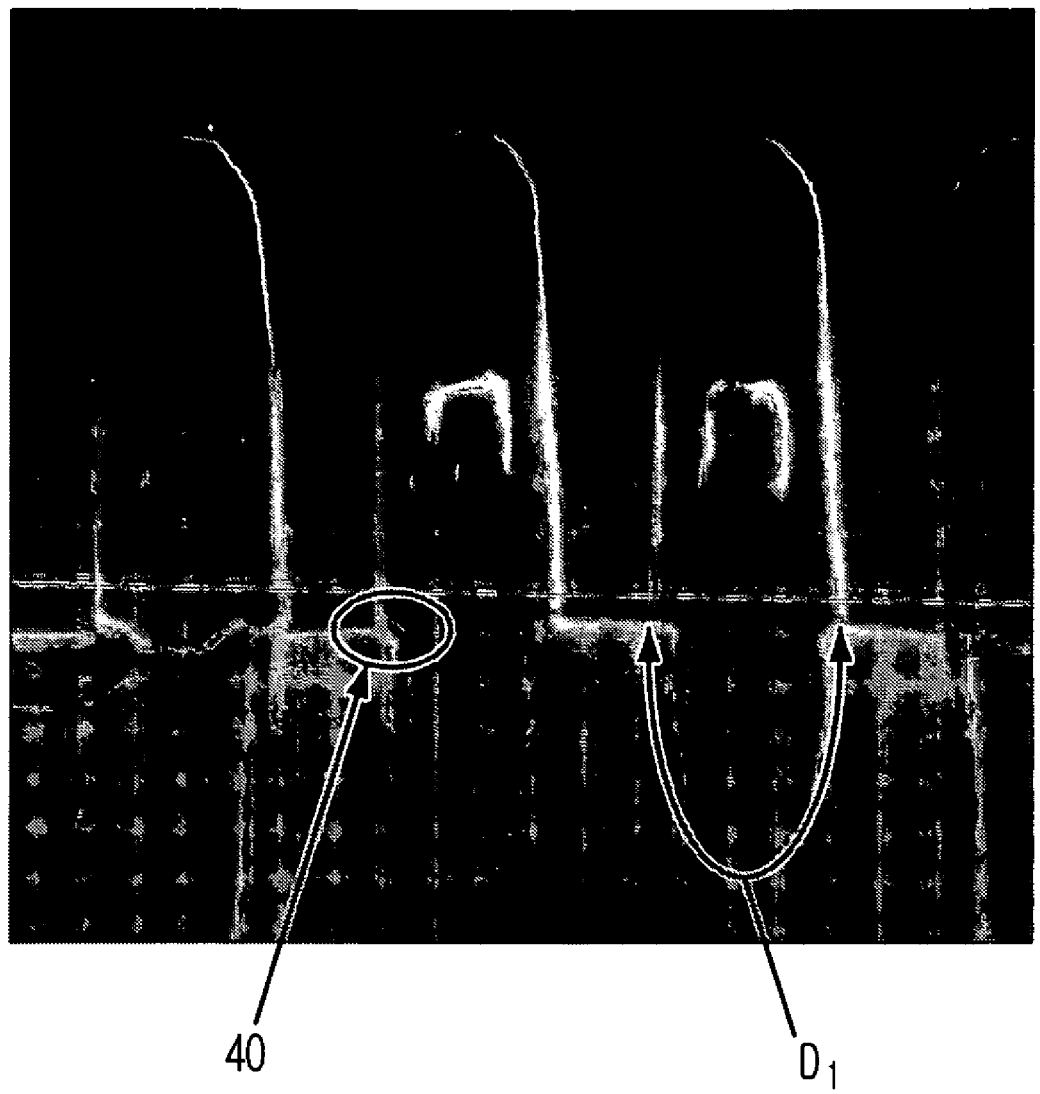
FIG. 2 is a micrographic image of a 'U' shaped recess profile of a semiconductor device formed by the typical method.
Figure 3A:
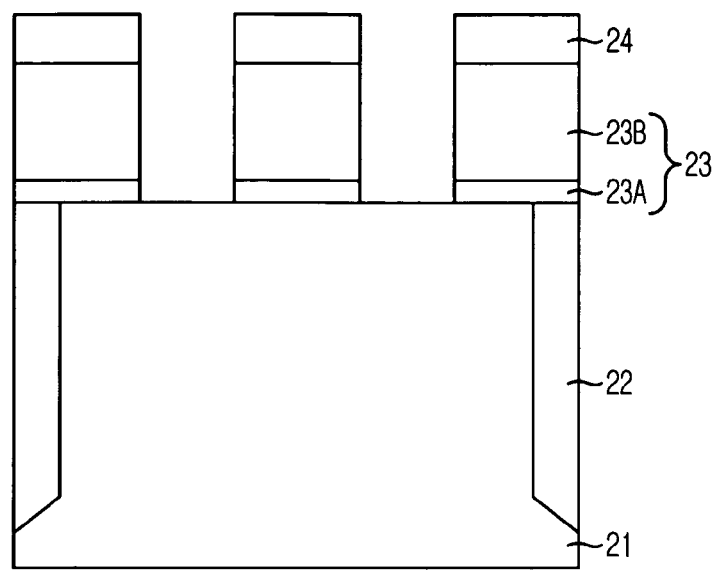
FIGS. 3A to 3E are cross-sectional views illustrating a method for fabricating a semiconductor device consistent with an embodiment of the present invention.

As shown in FIG. 3A, a plurality of device isolation layers 22 are formed in certain portions of a substrate 21 to define an active region. Herein, the device isolation layers 22 have a thickness of approximately 3,000 Å or less.

In more detail of the formation of the device isolation layers 22, the certain portions of the substrate 21 are etched to form a plurality of trenches. An insulation layer is formed to fill the trenches, and the insulation layer filled into the trenches is subjected to a chemical mechanical polishing (CMP) process to form the device isolation layers 22. The device isolation layers 22 are isolated from each other through the CMP process.

Although not shown, a pad oxide layer and a hard mask layer are sequentially formed over the device isolation layers 22. The hard mask layer serves to secure a margin of a photoresist layer during a subsequent etching process on the substrate 21, and the hard mask is formed with polysilicon.

The photoresist layer is formed over the hard mask layer and then, patterned by performing a photo-exposure process and a developing process. The patterned photoresist layer is denoted with a reference numeral 24. Afterwards, the hard mask layer and the pad oxide layer are etched using the patterned photoresist layer 24 as an etch mask. The hard mask pattern and a patterned pad oxide layer are denoted with reference numerals 23B and 23A, respectively. The hard mask pattern 23B and the patterned pad oxide layer 23A are collectively referred to as a mask pattern 23.

Figure 3B:
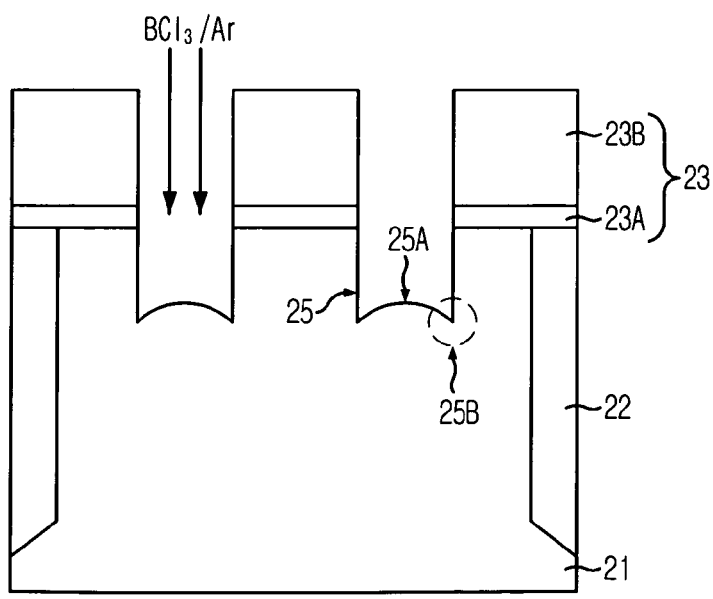

Referring to FIG. 3B, the patterned photoresist layer 24 is removed using oxygen plasma.

Predetermined portions of the substrate 21 are then etched by using the mask pattern 23 as an etch mask to form a plurality of first recesses 25.

As FIG. 3B shows, bottom edge portions 25B of each of the first recesses 25 are deeper than a bottom middle portion 25A. In more detail, the bottom middle portion 25A of the corresponding first recess 25 is roundly projected, and the bottom edge portions 25B are tapered to have a micro-trench profile.

The tapered bottom edge portions 25B can be formed by a physical etch such as a plasma etching process included in a combination of a chemical etch and the physical etch. During the plasma etching process, ions forming plasma are accelerated in a plasma chamber and collide against a layer to be etched. The physical etch can be performed with directionality by focusing the ions in a certain direction. Thus, the bottom edge portions 25B can be etched deeper than bottom middle portion 25A during the physical etch.

Conditions to from the roundly projected bottom middle portion 25A and the tapered bottom edge portions 25B are as follows.

The etching process is performed by using a mixture gas obtained by mixing argon (Ar) gas, which is an inert gas, in boron trichloride ($BCl_3$) gas, which is a chlorine-based gas, in a high density plasma apparatus. If the etching process is performed by adding the Ar gas, polymers are generated by the Ar gas. The polymers cause an electron charge-up phenomenon and as a result, active ions in the plasma collide against sidewalls to be etched. Accordingly, an etching can be performed very well in a bottom portion of the etched sidewalls and finally, an etch profile having the micro-trench shape can be formed.

In more detail of the etching process, a percentage of the Ar gas in the mixture gas ranges from approximately 4% to approximately 10%. A power ranges from approximately 500 W to approximately 2,000 W, and a pressure ranges from approximately 4 mTorr to approximately 8 mTorr.

Figure 3C:
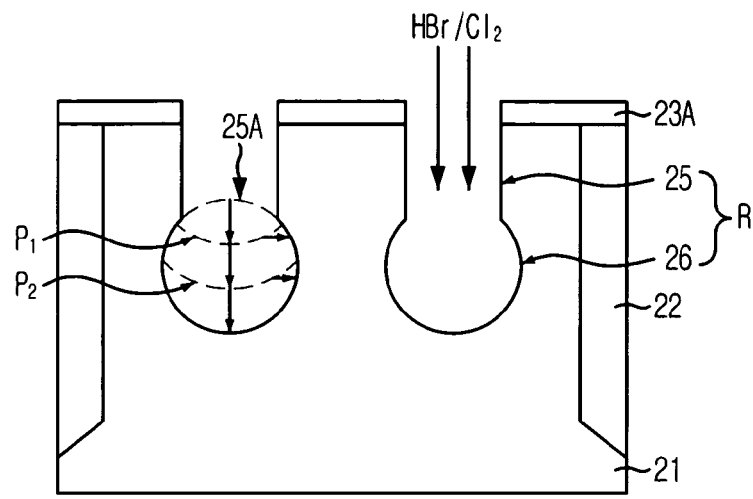

As shown in FIG. 3C, bottom portions of the first recesses 25 are etched using the mask pattern 23 as an etch mask to form a plurality of second recesses 26. The second recesses 26 are rounded, and are wider than the first recesses 25. The hard mask pattern 23B is then removed and the patterned oxide layer 23A remains.

As described above, an etching process is performed by using a mixture gas to form the rounded second recesses 26. The mixture gas can be obtained by mixing chlorine ($Cl_2$) and hydrogen bromide (HBr).

If silicon is etched using the mixture gas, the roundly projected bottom middle portion 25A is bombarded directly by the ions and is therefore etched faster than the tapered bottom edge portions 25B having the micro-trench profile. Accordingly, the second recesses 26 are formed to have a round structure. Furthermore, during the etching process for forming the second recesses 26, a sidewall etching process, i.e., an isotropic etching process, is performed on the tapered bottom edge portions 25B. As a result, the second recesses 26 are wider than the first recesses 25. In FIG. 3C, $P_1$ and $P_2$ indicate the stages of the etching for forming the second recesses 26.

Accordingly, recesses R including respective first recesses 25 and respective second recesses 26 are formed in a bulb shape with a channel longer than that of a 'U' shaped recess.

Figure 3D:
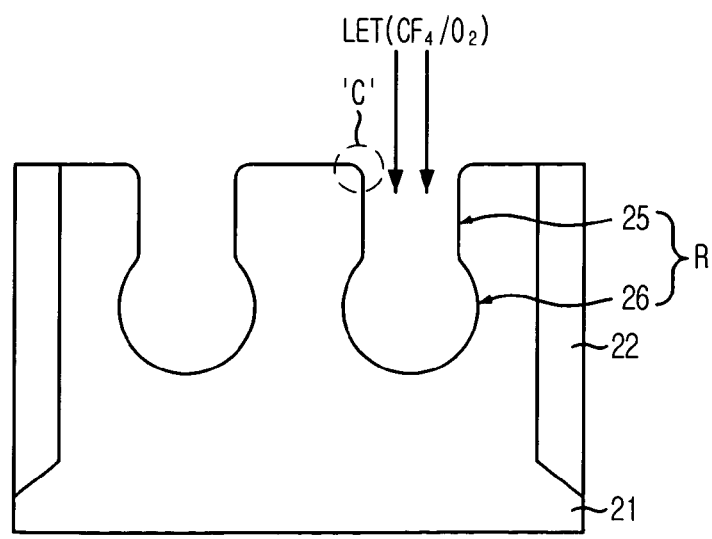

As shown in FIG. 3D, a cleaning process is performed to remove residues and the patterned pad oxide layer 23A after the etching process. The cleaning process is performed using one of hydrogen fluoride (HF) solution and buffered oxide etchant (BOE).

A rounding process is carried out to round top corners of the recesses R, as indicated by denotation 'C' in FIG. 3D. As the rounding process, a light etch treatment (LET) process etching a damaged layer is performed using a mixture gas of tetrafluoromethane ($CF_4$) and oxygen ($O_2$).

Accordingly, the top corners of the recesses R become rounded and a stress point of a leakage current is removed, thereby improving a refresh property.

Figure 3E:
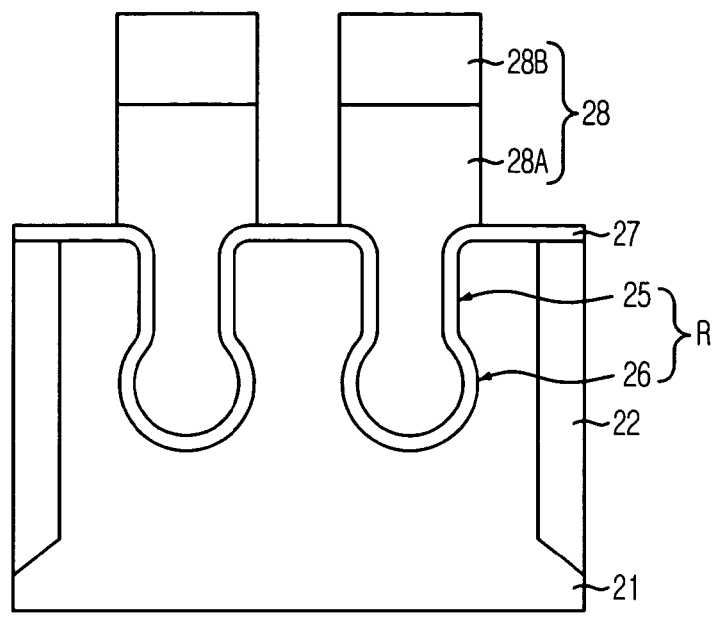

As shown in FIG. 3E, a gate insulation layer 27 is formed over the substrate 21 including the recesses R. A plurality of gate patterns 28 are then formed over the gate insulation layer 27. One portion of the individual gate pattern 28 is filled into the recess R, and the other portion of the individual gate pattern 28 is projected above an upper portion of the substrate 21.

Each of the gate patterns 28 is formed by sequentially stacking a gate electrode 28A and a gate hard mask 28B. The gate electrode 28A is formed with a stack structure of polysilicon and $WSi_x$, and the gate hard mask 28B is formed of silicon nitride ($Si_3N_4$).

Figure 4A:
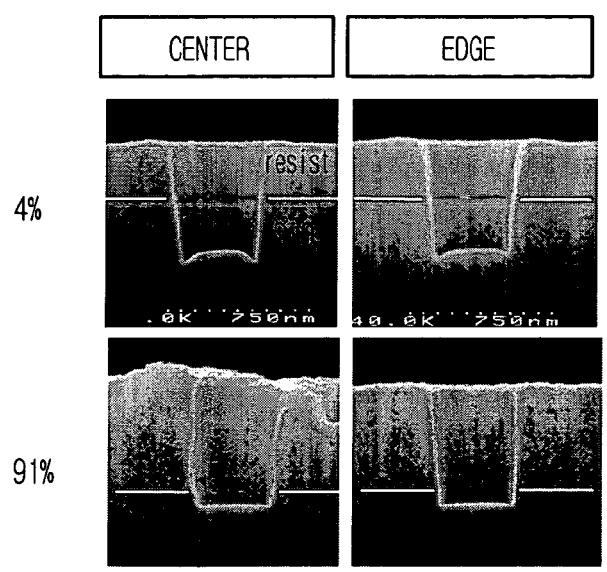
FIG. 4A is a cross-sectional view illustrating micro-trenches formed by a plasma etching with different amounts of Ar gas.

FIG. 4A is a cross-sectional view illustrating micro-trenches formed in bottom edge portions 25B when different amounts of Ar gas are added in the mixture gas for forming the first recesses 25. As FIG. 4A shows, micro-trenches are more likely formed in the bottom edge portions when the percentage of the Ar gas in the total mixture gas is approximately 4% than when the percentage of the Ar gas in the total mixture gas is approximately 91%.

Figure 4B:
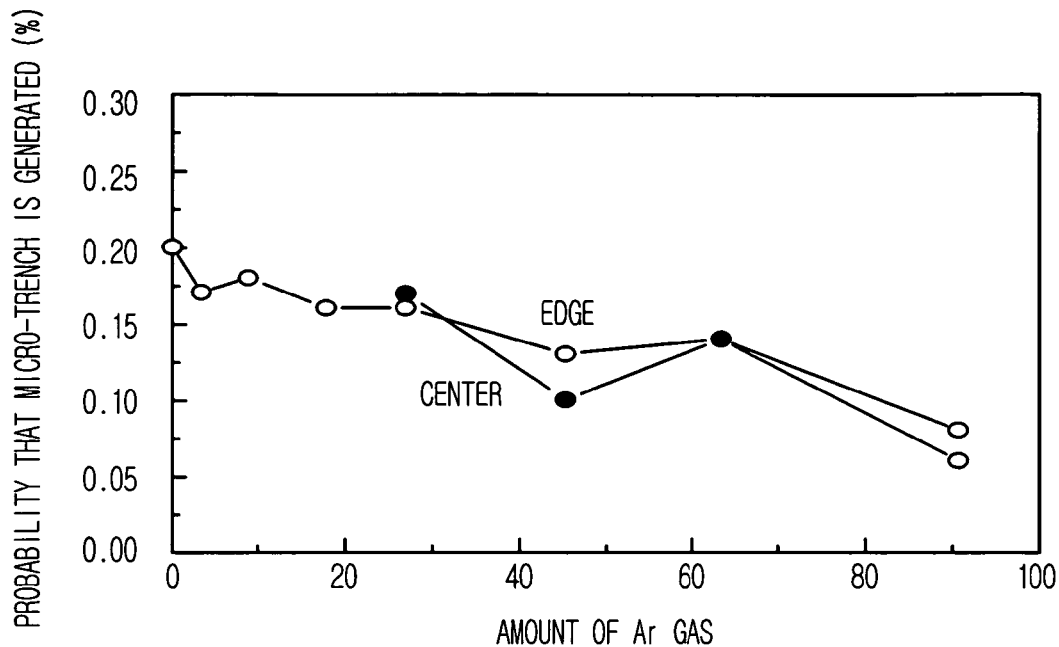
FIG. 4B is a graph illustrating a probability of a micro-trench being generated with respect to an amount of Ar gas.

FIG. 4B is a graph illustrating a probability of micro-trenches being formed depending on the amount of Ar gas added in the mixture plasma for forming the first recesses 25. As FIG. 4B shows, with the amount of Ar gas increasing, the probability of micro-trenches being formed decreases, and vice versa.

Figure 4C:
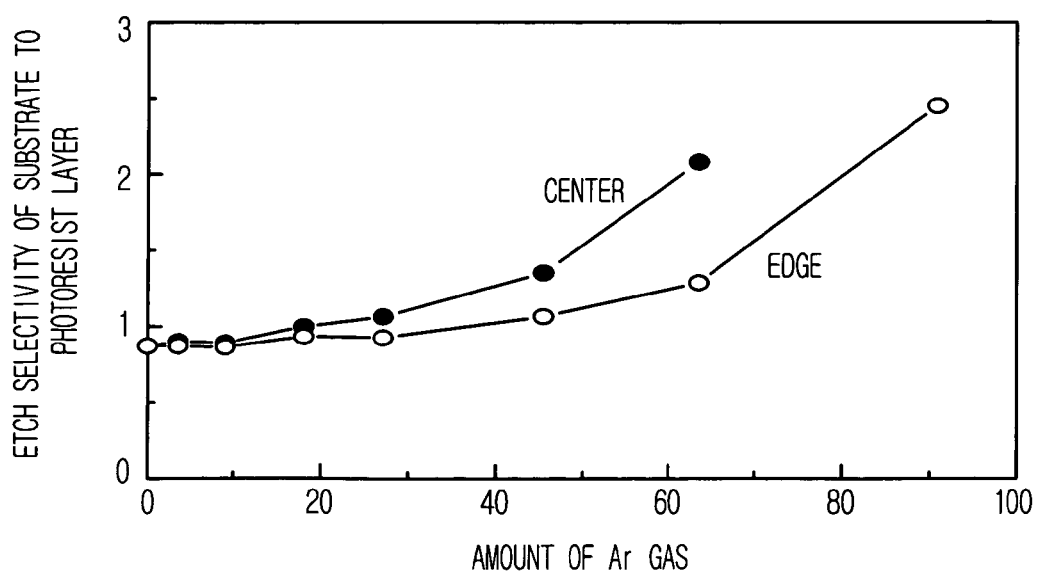
FIG. 4C is a graph illustrating an etch selectivity of silicon to a photoresist layer with respect to an amount of Ar gas.

FIG. 4C is a graph illustrating an etch selectivity of a substrate (i.e., silicon) to a photoresist layer changing with the amount of Ar gas added in the mixture gas for forming the first recesses 25. Referring to FIG. 4C, as the amount of the Ar gas increases, the etch selectivity of the substrate to the photoresist layer increases.

Figure 4D:
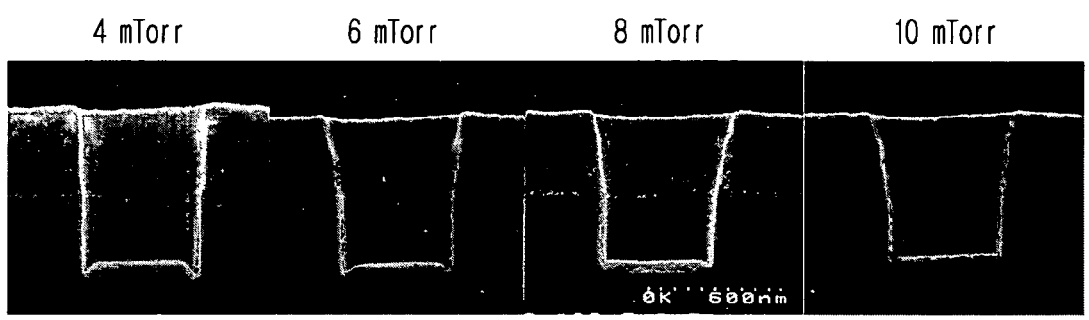
FIG. 4D is a cross-sectional view illustrating micro-trenches formed by a plasma etching with different pressures.

FIG. 4D is a cross-sectional view of micro-trenches formed in bottom edge portions 25B when different pressures are applied in the plasma etching for forming the first recesses 25.

As FIG. 4D shows, the micro-trench gradually disappears as the pressure increases. When the pressure decreases, a mean free path of gas particles increases and the ions in the plasma can be more easily focused at the bottom edge portions 25B. As a result, it is easier to form micro-trenches under lower pressures.

Figure 4E:
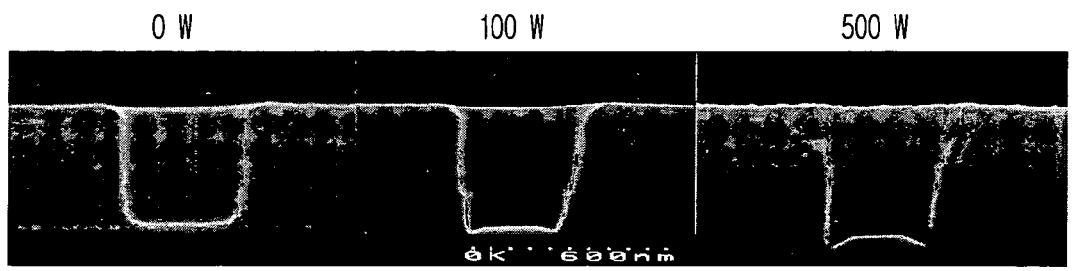
FIG. 4E is a cross-sectional view illustrating micro-trenches formed by a plasma etching with different powers.

FIG. 4E is a cross-sectional view of micro-trenches formed in the bottom edge portions 25B when different powers are applied in the plasma etching for forming the first recesses 25. As FIG. 4E shows, the micro-trenches are more likely formed as the power increases, because a probability of the plasma ions being reflected is increased, thereby increasing a flow rate of the ions.

Comparing the embodiment of the present invention to the typical method, the typical method uses the mixture gas of $Cl_2$ and Br and accordingly, a horn is formed at edge portions of the active region. However, consistent with the embodiment of the present invention, the edge portions of the active region where the horn is generated is etched faster by using a mixture gas of $BCl_3$ and Ar. Accordingly, a micro-trench can be formed.

Figure 5:
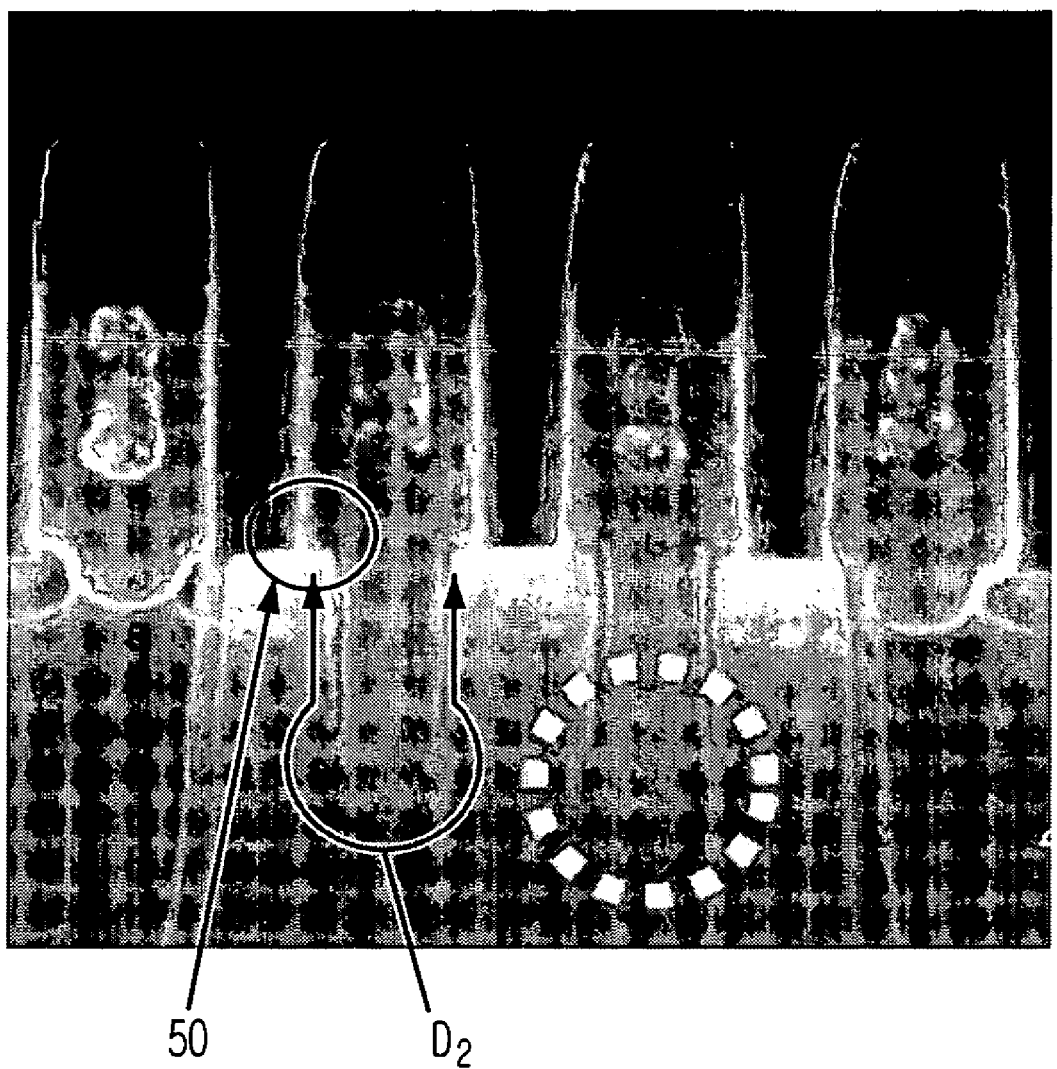
FIG. 5 is a micrographic image of a recess profile of a semiconductor device formed by a method consistent with the embodiment of the present invention.

FIG. 5 is a micrographic image of a recess profile of a formed by a method consistent with embodiments of the present invention. As FIG. 5 shows, the bulb-shaped recess profile has a channel length $D_2$, and a top corner 50 of the recess is rounded. As a result, the bulb-shaped recess profile consistent with the embodiment of the present invention has a longer channel than the typical 'U' shaped recess profile.

As described above, the micro-trench is formed and thus, the horn can be removed. The bulb-shaped recess is formed and thus, a channel length can be increased. Also, the rounding process is performed to reduce the stress point. Accordingly, a leakage current can be reduced.

A bulb-shaped recess is used as a channel consistent with the embodiment of the present invention and thus, a channel length and a channel area can be increased. Because of the bulb-shaped recess, a threshold voltage can be increased and a breakdown voltage property can be improved. Furthermore, a recess top corner can be rounded, improving a refresh property.

While the present invention has been described with respect to certain embodiments, it will be apparent to those skilled in the art that various changes and modifications may be made without departing from the spirit and scope of the invention as defined in the following claims.

What is claimed is:

1. A method for fabricating a semiconductor device, comprising:
    etching a predetermined portion of a substrate to form a first recess having a bottom middle portion roundly projected and bottom edge portions tapered to have a micro-trench profile, the bottom edge portions being deeper than the bottom middle portion; and
    etching the substrate beneath the first recess to form a second recess, the second recess being rounded and being wider than the first recess,
    wherein forming the first recess includes performing a plasma etching with a mixture gas including a chlorine-based gas and an inert gas.

2. The method of claim 1, wherein a percentage of the inert gas in the mixture gas ranges from 4% to 10%.

3. The method of claim 1, wherein the chlorine-based gas includes boron trichloride ($BCl_3$).

4. The method of claim 1, wherein the inert gas includes argon (Ar).

5. The method of claim 1, wherein forming the first recess includes performing a plasma etching with a power ranging from 500 W to 2,000 W.

6. The method of claim 1, wherein forming the first recess includes performing a plasma etching with a pressure ranging from 4 mTorr to 8 mTorr.

7. The method of claim 1, wherein forming the second recess includes performing a plasma etching with a mixture gas including chlorine ($Cl_2$) gas and hydrogen bromide (HBr) gas.

8. The method of claim 1, wherein the first recess and the second recess constitute a bulb-shaped recess.

9. The method of claim 1, wherein forming the first recess includes etching the substrate using a mask pattern including an oxide-based layer and a polysilicon-based hard mask as an etch mask.

10. A method for fabricating a semiconductor device, comprising:
    etching a predetermined portion of a substrate to form a first recess having a roundly projected bottom middle portion and bottom edge portions tapered to have a micro-trench profile, the bottom edge portions being deeper than the bottom middle portion;
    etching the substrate beneath the first recess to form a second recess, the second recess being rounded and being wider than the first recess;
    rounding top corners of the first recess;
    forming a gate insulation layer over the substrate with the first recess and the second recess formed therein; and
    forming a gate pattern having a first portion filled into the first and second recesses and a second portion projected above the substrate over the gate insulation layer;
    wherein forming the first recess includes performing a plasma etching with a mixture gas including a chlorine-based gas and an inert gas.

11. The method of claim 10, wherein a percentage of the inert gas in the mixture gas range from 4% to 10%.

12. The method of claim 10, wherein the chlorine-based gas includes $BCl_3$.

13. The method of claim 10, wherein the inert gas includes Ar.

14. The method of claim 10, wherein forming the first recess includes performing a plasma etching with a power ranging from 500 W to 2,000 W, and a pressure ranging from 4 mTorr to 8 mTorr.

15. The method of claim 10, wherein forming the second recess includes performing a plasma etching with a mixture gas including $Cl_2$ and HBr.

16. The method of claim 10, wherein forming the first recess includes etching the substrate using a mask pattern comprised of an oxide layer and a polysilicon hard mask as an etch mask.

17. The method of claim 10, wherein rounding the top corners of the first recess includes performing a plasma etching with a mixture gas including tetrafluoromethane ($CF_4$) and oxygen ($O_2$).

* * * * *